(12) United States Patent
Mattausch et al.

(10) Patent No.: US 6,853,251 B2
(45) Date of Patent: Feb. 8, 2005

(54) SELF-ADJUSTING WINNER LINEUP AMPLIFIER

(75) Inventors: Hans Jürgen Mattausch, Higashihiroshima (JP); Tetsushi Koide, Higashihiroshima (JP)

(73) Assignee: President of Hiroshima University, Higashihiroshima (JP)

( * ) Notice: Subject to any disclaimer, the term of this patent is extended or adjusted under 35 U.S.C. 154(b) by 0 days.

(21) Appl. No.: 10/445,033

(22) Filed: May 27, 2003

(65) Prior Publication Data

US 2003/0223600 A1 Dec. 4, 2003

(30) Foreign Application Priority Data

May 31, 2002 (JP) ........................ 2002-159436

(51) Int. Cl.[7] .............................................. H03F 1/08
(52) U.S. Cl. .................................... 330/293; 330/279
(58) Field of Search ................................ 330/293, 279, 330/136, 311; 365/49

(56) References Cited

U.S. PATENT DOCUMENTS

| | | | | |
|---|---|---|---|---|
| 4,757,454 A | * | 7/1988 | Hisatake et al. | ............... 701/35 |
| 5,148,329 A | * | 9/1992 | Yamauchi et al. | .......... 386/103 |
| 5,428,565 A | | 6/1995 | Shaw | |
| 5,978,246 A | | 11/1999 | Shindo | |
| 6,307,798 B1 | | 10/2001 | Ahmed et al. | |

OTHER PUBLICATIONS

Hans Jürgen Mattausch, et al. "An Architecture for Compact Associative Memories With DECA–NS Nearest–Match Capability up to Large Distances" ISSCC Dig. of Tech. Papers, 2001, pp. 170–171 and 443.

Ion E. Opris "Rail–to–Rail Multiple–Input Min/Max Circuit" IEEE Transactions on Circuits and Systems–II: Analog and Digital Signal Processing, vol. 45, No. 1, Jan. 1998, pp. 137–140.

Hans Jürgen Mattausch, et al. "Compact Associative–Memory Architecture With Fully Parallel Search Capability for the Minimum Hamming Distance" IEEE Journal of Solid–State Circuits, vol. 37, No. 2, Feb. 2002, pp. 218–227.

Hans Jürgen Mattausch, et al."Fully–Parallel Pattern–Matching Engine With Dynamic Adaptability to Hamming or Manhattan Distance" 2002 IEEE 2002 Symposium on VLSI Circuits Digest of Technical Papers, 4 pages, (Jun. 13, 2002 to Jun. 15, 2002).

* cited by examiner

*Primary Examiner*—Henry Choe
(74) *Attorney, Agent, or Firm*—Oblon, Spivak, McClelland, Maier & Neustadt, P.C.

(57) ABSTRACT

A self-adjusting winner lineup amplifier comprising signal control sections which level-control comparison signals ($C_i$) from word weighted comparators of a memory area, a self-adjusting distance amplifying section corresponding to the respective rows in the memory area which outputs the level-controlled comparison signals ($C_i$) as distance amplified signals ($LA_i$), a feedback generating section which inputs a self-adjusting voltage ($F_a$) common to the distance amplifying sections, and a voltage follower which converts its input voltage (min$\{C_i\}$; a minimum value of $C_i$) into a feedback voltage (F) to supply the feedback voltage (F) in parallel and with strong driving current to the signal control sections, wherein amplification characteristics of the distance amplifying section are self-adjusted by a comparison signal ($C_{win}$) of a winner row, and the signal control sections lead the comparison signal ($C_{win}$) into the range of a maximum gain area of the distance amplifying section.

9 Claims, 7 Drawing Sheets

SELF-ADJUSTING WINNER LINEUP AMPLIFIER

CROSS-REFERENCE TO RELATED APPLICATIONS

This application is based upon and claims the benefit of priority from the prior Japanese Patent Application No. 2002-159436, filed May 31, 2002, the entire contents of which are incorporated herein by reference.

BACKGROUND OF THE INVENTION

1. Field of the Invention

The present invention relates to an associative memory, and in particular, it relates to an optimum value detecting circuit which is used to realize a pattern matching function.

2. Description of the Related Art

Conventional optimum value detecting circuits for a semiconductor associative memory are known which have a stabilizing function based on feedback and a fixed maximum gain area. The semiconductor associative memories comprising the optimum value detecting circuit of this kind are proposed by H. J. Mattausch et al., "An Architecture for Compact Associative Memories with Deca-ns Nearest-Match Capability up to Large Distances", ISSCC Dig. Of Tech. Papers, pp. 170–171, 2001, and by Jpn. Pat. Appln. No. 2002-008783, for example.

An operation of the conventional optimum value detecting circuit, especially a winner lineup amplifier (hereinafter simply referred to as WLA) which amplifies a winner-loser distance will be described using FIG. 8. It should be noted that the semiconductor associative memory optimally retrieves the most analogous reference data to input data from reference data stored in a memory area on the basis of a scale called a distance between data. The optimum here means, for example, that the distance is the maximum or minimum. The reference data retrieved in accordance with the input data is called a winner, and the reference data that is not retrieved is called a loser. In addition, the WLA represents a winner-loser distance amplifying section directly concerned with data retrieval capability and its peripheral circuit sections, in the optimum value detecting circuit except for the memory area of the associative memory.

FIG. 8 is a diagram showing a block configuration of the conventional WLA. The WLA shown in FIG. 8 is constituted by signal control sections (SR) 100 which input a comparison signal $C_i$ (indicated as i=1, . . . , R in FIG. 8) from a word weighted comparator $WWC_i$ (not shown) belonging to a cell array in an i row of the associative memory, and a circuit block (AFG) 200 comprising the winner-loser distance amplifying section having a fixed maximum gain area and a feedback generating section.

The signal control section (SR) 100 converts a current intensity of the comparison signal $C_i$ into a signal voltage. At the same time, it comprises a function of adjusting this signal voltage to an intermediate potential $VI_i$ of the fixed maximum gain area of the winner-loser distance amplifying section. In this way, a signal $LA_i$ used to finally obtain a digital retrieval result is output from the circuit block (AFG) 200.

On the other hand, feedback signals F to the signal control section (SR) 100 and the word weighted comparator $WWC_i$ are generated by the feedback generating section incorporated in the circuit block (AFG) 200, thereby securing a stable operation of the WLA.

However, disadvantages of the conventional WLA lie in the fact that since a minimum distance input signal (comparison signal $C_i$) is amplified in the fixed maximum gain area and its operation is stabilized by the feedback, there is a limit in the range of stabilization control, and power consumption is increased. Moreover, in a conventionally applied feedback circuit, a load capacity of the signal control section increases if a number R of input signals $C_i$ is increased, which has prevented high-speed operation.

As described above, the problem of the conventional WLA is that the fixed maximum gain area limits the stabilization control range, and that the power consumption is increased.

The present invention has been attained to solve the above-mentioned problems, and an object thereof is to provide a WLA which has a larger control range in the feedback stabilization, comprises a self-adjusting function of the maximum gain area, and linearly increases the number of transistors in response to an increase in the number of reference data (number of rows in the memory).

BRIEF SUMMARY OF THE INVENTION

A self-adjusting WLA regarding one specific example of the present invention amplifies a comparison signal output from a word weighted comparator, which compares reference data stored in each row of a memory area with external input data per bit, in a range of a maximum gain area in a self-adjusting manner with high stability, and outputs the amplified comparison signal as a distance amplified signal for data retrieval.

More specifically, as shown in FIG. 3, this self-adjusting WLA comprises signal control sections which input a comparison signal $C_i$ from a word weighted comparator disposed in each row of a memory area; a self-adjusting distance amplifying section which amplifies the comparison signal $C_i$ whose level is shifted by the signal control section, and outputs the amplified comparison signal as a distance amplified signal $LA_i$; a feedback generating section which inputs a self-adjusting voltage $F_a$ common to the distance amplifying sections corresponding to the respective rows in the memory area; and a drive current generating section comprising a voltage follower which converts an output voltage $\min\{C_i\}$ from the feedback generating section into a feedback voltage F and generates a large driving current to quickly establish this feedback voltage F at its output. The feedback voltage F is then supplied in parallel to the signal control sections corresponding to the respective rows in the memory area, and amplification characteristics of the distance amplifying section are self-adjusted to a comparison signal $C_{win}$ of a winner row among the comparison signals $C_i$, and the signal control sections lead at least the comparison signal $C_{win}$ of the winner into the range of a maximum gain area of the distance amplifying section.

Here, the above self-adjusting WLA is shown in, for example, FIG. 3, and a suffix i of each symbol is the number that indicates a row number from a 1st row to a R-th row in the memory area. The symbol $\min\{C_i\}$ indicates a value proportional to a minimum value in the comparison signals $C_1$ to $C_R$ (comparison signal $C_{win}$ of the winner).

Preferably, the signal control section comprises a first signal line for the word weighted comparator which transfers the comparison signal $C_i$; a second signal line for the word weighted comparator which transfers a voltage $VDD_i$ for controlling electric power of the comparison signal $C_i$; a third signal line which supplies the feedback voltage F in parallel to the signal control sections corresponding to the respective rows in the memory area; a fourth signal line which activates the signal control sections; a first n channel transistor in which a drain is connected to the first signal line, a gate is connected to the third signal line and a source is grounded; a first p channel transistor in which a source is connected to a power source VDD, a gate is grounded and a drain is connected to the second signal line; and a second p channel transistor in which a source is connected to the power source VDD, a gate is connected to the fourth signal line and a drain is connected to the first signal line. The feedback voltage F is input to the gate of the first n channel transistor, and the comparison signal $C_i$ whose level is controlled by the first n-channel transistor is output from the drain of the first n channel transistor.

Figure 3A:
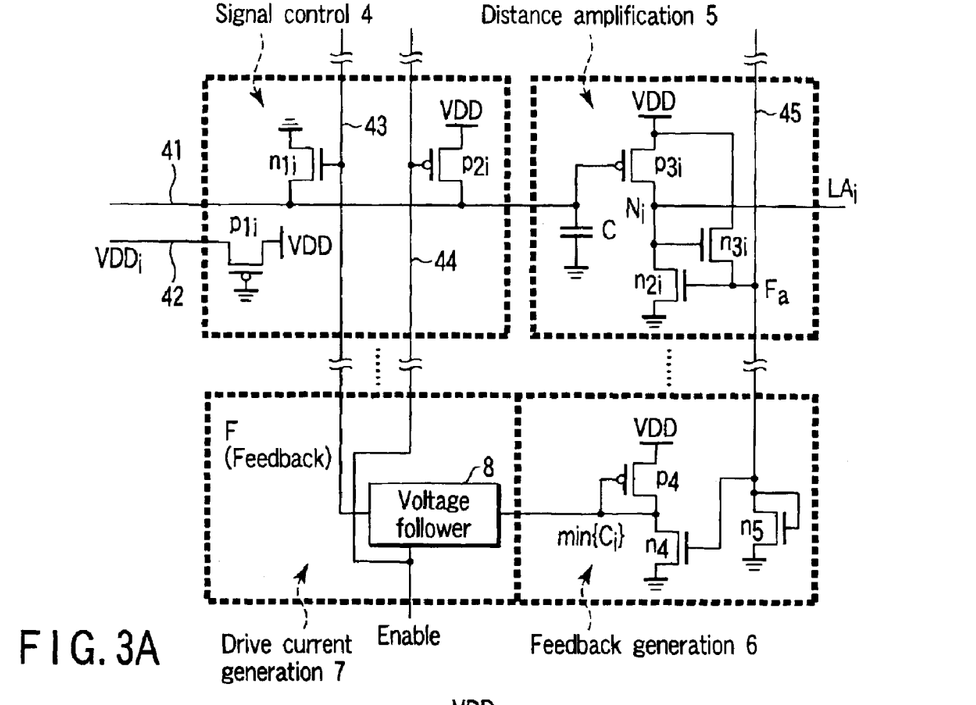
FIGS. 3A and 3B are diagrams showing an example of configuration based on a CMOS type circuit of the WLA in accordance with the present invention.

Here, a signal control section is indicated by, for example, a reference numeral 4 of FIG. 3, and controls a level of the comparison signal $C_{win}$ so as to adjust its signal level into the range of the maximum gain area of the distance amplifying section connected subsequent to the signal comparison sections. The voltage $VDD_i$ restricts the increase of electric power consumption of the comparison signal $C_i$ with size expansion of the associative memory by adjusting the signal level of the comparison signal $C_i$.

Furthermore, the self-adjusting distance amplifying section preferably comprises a third p channel transistor in which a source is connected to a power source VDD; a second n channel transistor in which the source is grounded; a third n channel transistor in which the drain is connected to the power source VDD, the source is connected to the gate of the second n channel transistor and the gate is connected to the drain of the second n channel transistor; and a capacity C one terminal of which is connected to the gate of the third p channel transistor and the other terminal of which is grounded. The drain of the third p channel transistor and the drain of the second n channel transistor are connected to each other to form an output section $N_i$, and the source of the third n channel transistor is connected to the common signal line of the self-adjusting voltage $F_a$, and the comparison signal $C_i$ whose level is controlled by the signal control section is input to the gate of the third p channel transistor, and the distance amplified signal $LA_i$ is output from the output section $N_i$, and further a source voltage of the third n channel transistor is transferred as the self-adjusting voltage $F_a$ to the common signal line.

Here, the self-adjusting distance amplifying section is what is indicated by, for example, a reference numeral 5 of FIG. 3, and the common signal line for the self-adjusting voltage $F_a$ is connected in common to $F_a$ output terminals in all the distance amplifying sections corresponding to the respective rows in the memory area, and a voltage of the common signal line is determined by the self-adjusting voltage $F_a$ corresponding to a winner row.

Furthermore, the feedback signal generating section preferably comprises a fourth p channel transistor in which a source is connected to the power source VDD and a gate is connected in common with a drain; a fourth n channel transistor in which a drain is connected to the drain of the fourth p channel transistor to form an output section of the feedback generating section, a gate is connected to the common signal line of the self-adjusting voltage $F_a$ and a source is grounded; and a fifth n channel transistor in which the drain is connected to the common signal line of the self-adjusting voltage $F_a$, the gate is connected in common with the drain and the source is grounded. The self-adjusting voltage $F_a$ is input to the gate of the fourth n channel transistor, and the output voltage $\min\{C_i\}$ is output from the output section of the feedback generating section.

Here, the feedback generating section is indicated by a reference numeral 6 of FIG. 3A, and the feedback generating section 6 here has a current mirror relation with the distance amplifier 5 of a prior step, and can output the $\min\{C_i\}$ via the common self-adjusting voltage $F_a$.

Furthermore, the voltage follower constituting the drive current generating section preferably inputs the output voltage $\min\{C_i\}$ from the feedback generating section, converts it into a feedback voltage F, and supplies this feedback voltage F in parallel and with large driving capability from the output section of the voltage follower to the gate of the first n channel transistor in the signal control sections corresponding to each row in the memory area, and the voltage follower is activated simultaneously with the signal control section.

Figure 3B:
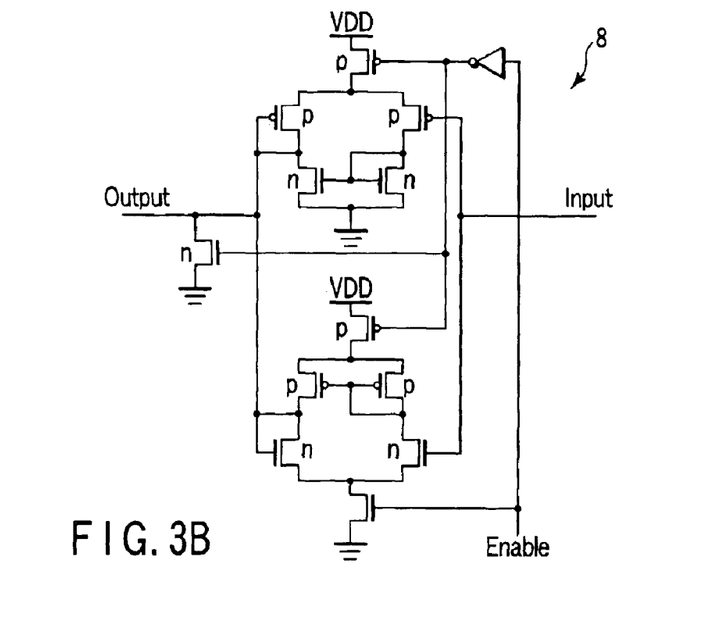

Here, the drive current generating section is indicated by, for example, a reference numeral 7 of FIG. 3A, and the voltage follower 8 is constituted by, for example, two current mirror type differential amplification circuits disposed in parallel which use an n-MOS and p-MOS for inputs as shown in FIG. 3B.

Furthermore, in the self-adjusting WLA in this specific example, an equivalent operation is possible by replacing the n channel transistor with the p channel transistor constituting the circuit or vice versa, and replacing the n channel transistor with p channel transistor constituting the memory area or vice versa.

Still further, in the self-adjusting WLA in this specific example, the number of transistors constituting the circuit can be proportional to the number of rows R in the memory area. The number of transistors necessary to constitute the WLA in this specific example is only six per row in the memory area, so that the circuit size can easily be expanded.

Furthermore, the voltage $VDD_i$ which controls the electric power of the comparison signal $C_i$ can restrict a maximum value of current flowing through the word weighted comparator to reduce the power consumed by the comparison signal $C_i$.

In addition, the voltage VDD can enlarge an electrostatic signal difference $|C_{win}-C_{lose}|$ in a static state between the comparison signal $C_{win}$ of a winner row and the comparison signal $C_{lose}$ of a loser row output from the word weighted comparator.

DETAILED DESCRIPTION OF THE INVENTION

Embodiments of the present invention will hereinafter be described in detail in reference to the drawings.

Figure 1:
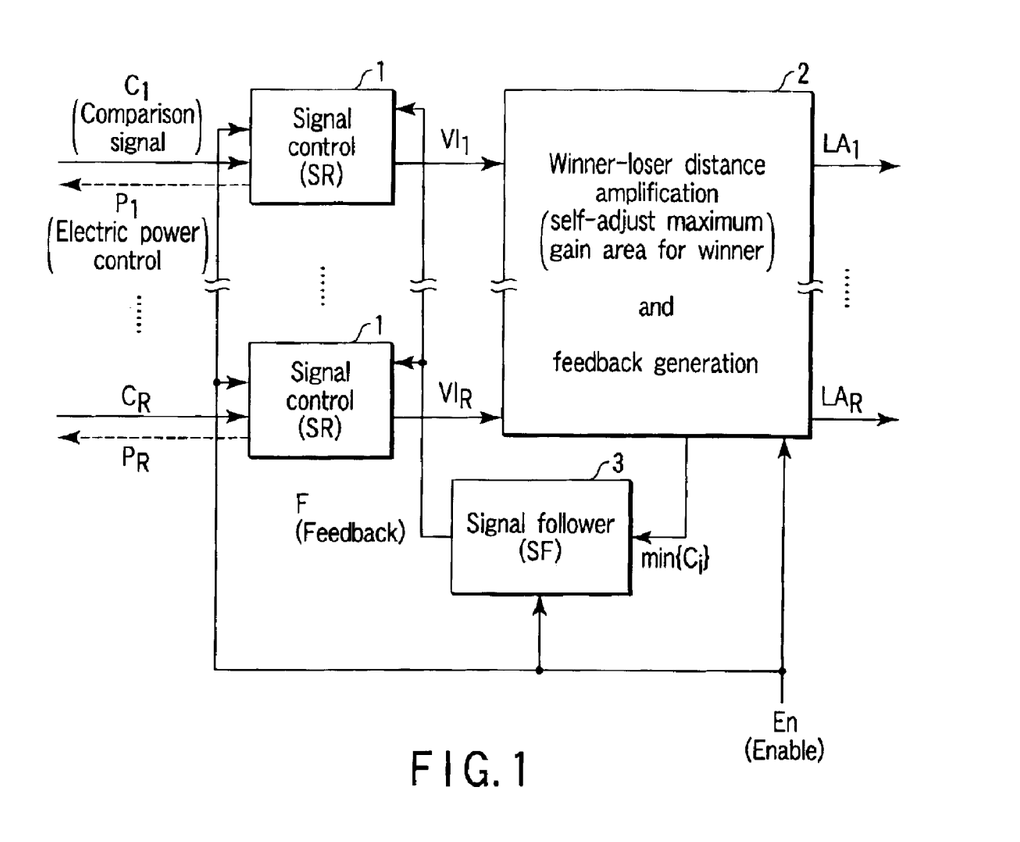
FIG. 1 is a block diagram of a self-adjusting WLA having a maximum gain area in accordance with a first embodiment of the present invention.

FIG. 1 shows a first embodiment of the present invention. FIG. 1 is a diagram showing a block configuration of a WLA in accordance with the first embodiment. An operation of the self-adjusting WLA of the present invention will be described below using FIG. 1.

The WLA shown in FIG. 1 comprises signal control sections (SR) 1 which input a comparison signal $C_i$ from a word weighted comparator $WC_i$ or a word weighted comparator WWCI (not shown, the suffix i indicates row numbers 1 to R), respectively arranged in rows of a memory area of a semiconductor associative memory, a circuit block (AFG) 2 comprising a winner-loser distance amplifying section having a self-adjusted maximum gain area and a feedback generating section, and a signal follower (SF) 3.

The signal control sections (SR) 1, which are correspondingly provided for the respective rows in the memory area, control a level of the comparison signal $C_i$ on receipt of a feedback signal F output from the signal follower (SF) 3, and output it as an intermediate voltage signal $VI_i$.

The winner-loser distance amplifying section disposed in the circuit block (AFG) 2 receives the intermediate voltage signal $VI_i$ within a range of the self-adjusted maximum gain area, and then outputs it as a distance amplified signal $LA_i$. The distance amplified signal $LA_i$ is sent to a final decision circuit (not shown), and thus a retrieval result of reference data stored in the memory area is output.

On the other hand, the winner-loser distance amplifying sections each corresponding to a 1st row to a R-th row in the memory area are internally connected to each other by a common self-adjusting voltage signal line 45 (refer to FIG. 3), and a self-adjusting voltage is transferred to the feedback generating section disposed at a tail end of the circuit block (AFG) 2 via the self-adjusting voltage signal line 45.

Receiving the self-adjusting voltage, the feedback generating section transfers a signal min$\{C_i\}$ proportional to a minimum value in the comparison signals $C_1$ to $C_R$ (including the case where they are equal) to the signal follower (SF) 3. The signal follower (SF) 3, on receipt of the min$\{C_i\}$, converts it to a feedback voltage F, and the signal control section (SR) 1 receives the feedback voltage F and thus controls the level of the comparison signal $C_i$.

As described above, in the WLA of the present invention, a level control amount in the signal control section (SR) 1 can lead an intermediate voltage signal $VI_{win}$ of a winner row into a range of the maximum gain area in the next-step winner-loser distance amplifying section in which amplification characteristics are self-adjusted, via a feedback loop comprising the signal control sections (SR) 1, the circuit block (AFG) 2 having the winner-loser distance amplifying section and feedback generating section, and the signal follower (SF) 3.

What is meant here by the self-adjustment of the amplification characteristics is that the amplification characteristics automatically change in response to the feedback so that the winner row is maximally amplified in accordance with an input level of the winner, and its circuit configuration and operation will be described in detail in a second embodiment.

Next, problems when the amplification characteristics of the winner-loser distance amplifying section are fixed whereas the signal level of the comparison signal $C_i$ changes will be described concretely using FIGS. 2A to 2C.

Figure 2A:
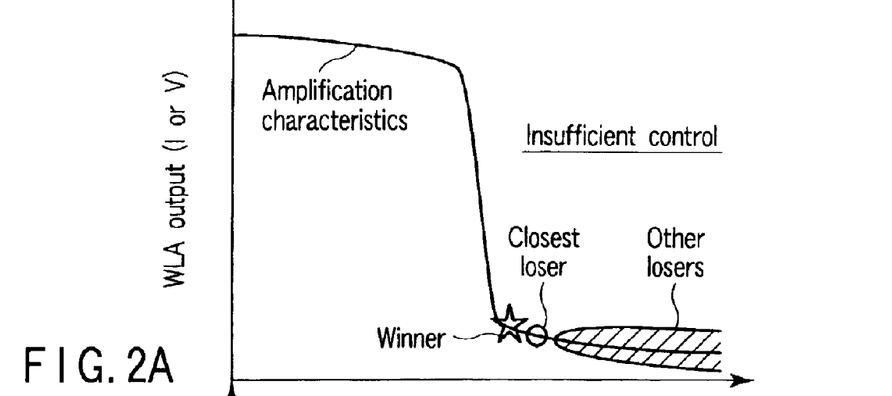
FIGS. 2A to 2C are graphs showing problems of the WLA having a fixed maximum gain area for distance amplification.
Figure 2B:
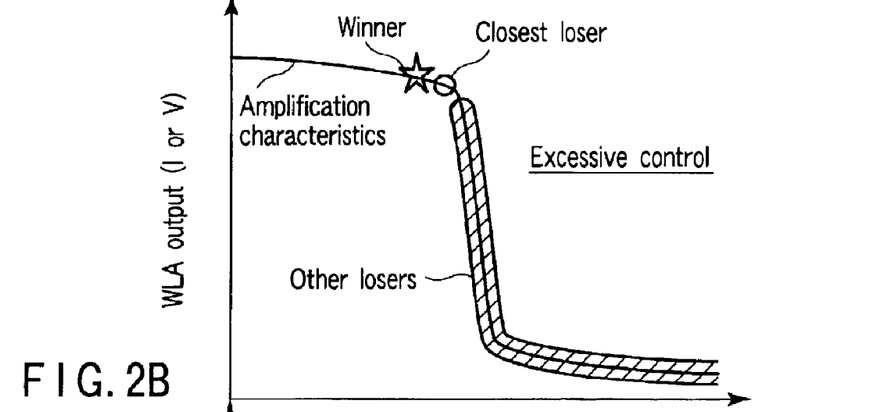
Figure 2C:
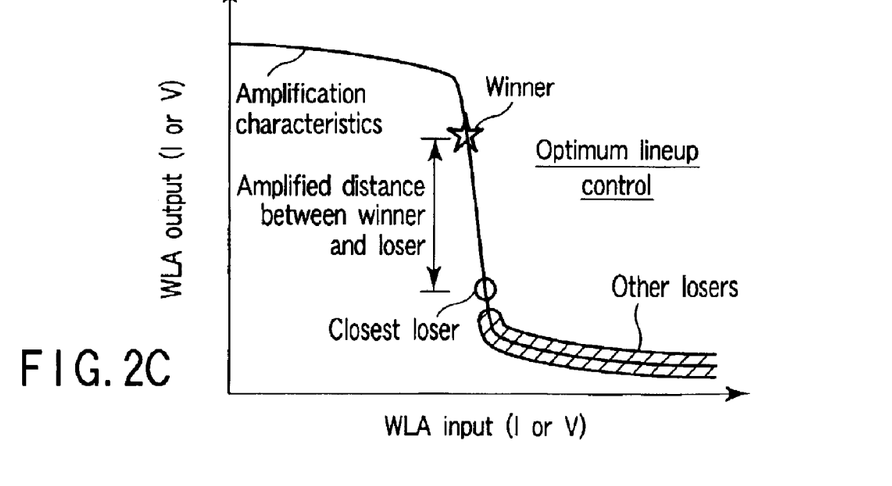

FIG. 2A, FIG. 2B and FIG. 2C show input/output amplification characteristics of the winner-loser distance amplifying section, in which horizontal axes of the graphs indicate the voltage or current of the input signal of the WLA, and vertical axes of the graphs indicate the voltage or current of the output signal of the WLA.

Figure 8:
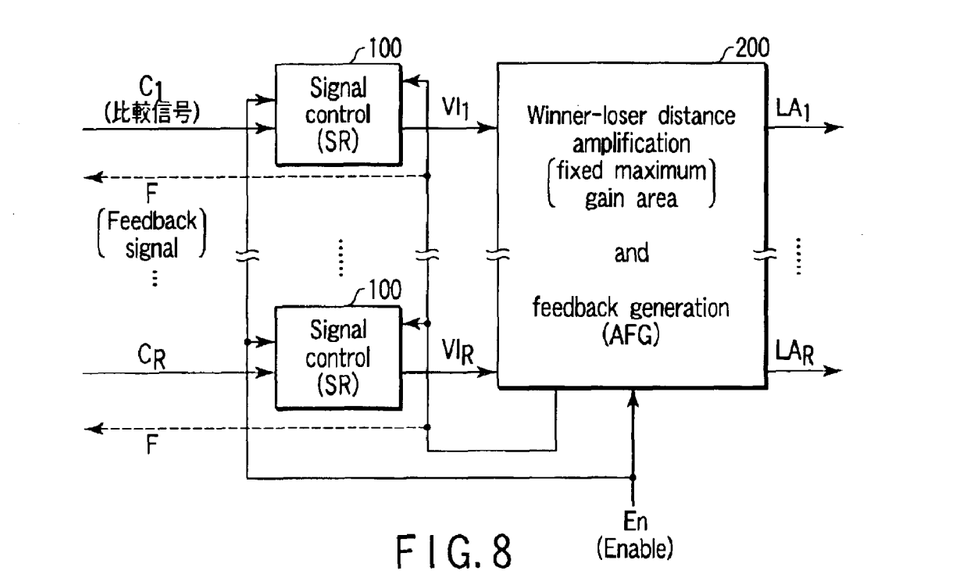
FIG. 8 is a block diagram of a conventional WLA having a fixed maximum gain area.

In the conventional WLA described earlier using FIG. 8 in which the feedback loop does not have a self-adjusting function of the maximum gain area of the amplifying section, when an input signal level deviates from a designed value due to unevenness caused in a manufacturing process, it is not possible to correct the deviation from a designed center even if a signal control section (SR) 100 performs level control.

Thus, this causes an insufficient control state shown in FIG. 2A, or an excessive control state shown in FIG. 2B. As a result, it is difficult for the WLA to distinguish a winner denoted by an asterisk in the graph from a closest loser denoted by a circle in the graph due to the unevenness in the manufacturing process, which causes a problem that a yield ratio of the semiconductor associative memories is decreased.

Contrarily, in the self-adjusting WLA in accordance with the first embodiment, even when the unevenness is caused in the manufacturing process, a level control value of the input signal level and the amplification characteristics of the winner-loser distance amplifying section are adjusted by the input signal level via the feedback loop in the signal control sections (SR) 1 shown in FIG. 1, so that the input signal level will always be in the range of the self-adjusted maximum gain area of the winner-loser distance amplifying section, i.e., that the WLA will be in a state of an optimum lineup control shown in FIG. 2C.

As a result, the distance between the winner which is the most important for data retrieval and the closest loser can be output within the range of the maximum gain area of the WLA despite the unevenness caused in the manufacturing process, as shown in FIG. 2C, thereby achieving improvements in the retrieval capability and yield ratio of the associative memory.

FIGS. 3A and 3B shows the second embodiment of the present invention. The WLA in accordance with the second embodiment will be described below using FIGS. 3A and 3B. As described earlier using FIG. 1, the key circuit in improving the performance of the associative memory is the WLA realizing the self-adjusting maximum gain area which automatically follows the output of the winner row. As the maximum gain area has conventionally been fixed, a WC output of the winner row needed to be designed suitably to the narrow maximum gain area (refer to H. J. Mattausch et al.).

The concept of the WLA in accordance with the present invention is to eliminate the possibility of inefficient data retrieval due to the insufficient control or excessive control described using FIGS. 2A to 2C, and to make it possible to speed up a control process of the WLA. A specific circuit configuration and operation of the WLA having a self-adjusting function will be described in detail in the second embodiment.

The WLA shown in FIG. 3A is constituted by a signal control section 4 which shows the circuit configuration of the signal control section (SR) 1 of FIG. 1, a distance amplifying section 5 corresponding to the winner-loser distance amplifying section at a front step portion of the circuit block (AFG) 2 of FIG. 1, a feedback generating section 6 corresponding to a rear step portion thereof, and a drive current generating section 7 corresponding to the signal follower (SF) 3 of FIG. 1. The drive current generating section 7 is constituted by a voltage follower 8.

A circuit configuration and operation of the signal control section 4 will first be described.

The signal control section 4 comprises a signal line 41 which transfers the comparison signal $C_i$ from a word weighted comparator (WWC) 13 (see FIG. 5), a signal line 42 which transfers a voltage $VDD_i$ for reducing the power consumed by the comparison signal $C_i$, a feedback signal line 43 connected to an output section of the voltage follower 8, and an enable signal line 44 for the signal control section 4.

A p channel transistor $P_{1i}$ (hereinafter referred to as transistor $P_{1i}$ or the like) supplies the signal line 41 from the word weighted comparator (WWC) 13 with the voltage $VDD_i$ for reducing the power consumed by the comparison signal $C_i$ in accordance with the signal level of the comparison signal $C_i$. A transistor $P_{2i}$ receives the enable signal from the outside at a gate, and thus applies a power source voltage VDD to the signal line 41 which transfers the comparison signal $C_i$ so as to activate the signal control section 4. Receiving at the gate a feedback voltage F from the voltage follower 8 via the feedback signal line 43, an n channel transistor $n_{1i}$ (hereinafter referred to as transistor $n_{1i}$ or the like) controls the signal level of the comparison signal $C_i$ to bring it to a grounded side by charging a gate capacity at high speed.

In this way, the signal control sections 4 correspondingly provided for the respective rows in the memory area can control the level of the comparison signal $C_i$ by receiving the feedback voltage F from the voltage follower 8 in the drive current generating section 7. For the control section of FIG. 3A, the intermediate signal $VI_i$ is thus in particular equal to the input signal $C_i$ and the function of the control section is just to control the level of $C_i$.

Next, a circuit configuration and operation of the self-adjusting distance amplifying section 5 will be described.

In the self-adjusting distance amplifying section 5, a transistor $n_{2i}$ and a transistor $p_{3i}$ are connected to each other in series, and their connection point is called $N_i$. The comparison signal $C_i$ whose level is controlled at signal control section 4 (corresponding to the intermediate voltage $VI_i$ of FIG. 1) is input to the gate of the transistor $p_{3i}$ and from the connection point $N_1$ the distance amplified signal $LA_i$ is outputted.

The distance amplification and the self-adjustment of maximum gain area are carried out as follows. Since a comparison signal $C_{win}$ of the word weighted comparator in the winner row is minimum (refer to FIG. 5 and related items mentioned), a transistor $P_{3win}$ (the transistor $p_{3i}$ in the winner row and so forth) demonstrates a capability as a maximum current source, and a current thereof must be proportional to a capability of a transistor $n_{2win}$ as a current sinking. Therefore, a gate voltage $F_a$ (referred to as self-adjusting voltage $F_a$) of the transistor $n_{2win}$ must be increased properly and because it is common to all the rows, it is thus controlled by the winner row.

On the other hand, this kind of operation is only possible if the gate voltage (an output voltage $LA_{win}$ of the WLA) of a source-follower-type transistor $n3_{win}$ is maximized. Further, such an operation produces the self-adjusting function of the maximum gain area, independently from the absolute value of the comparison signal $C_{win}$. In this way, it is possible to obtain an amplification gain of 20 to 50 times, for the signal difference $|C_{win}-C_{lose}|$ between the comparison signal $C_{win}$ of a winner row and the comparison signal $C_{lose}$ of a loser row. A capacitor C connected to an input of the distance amplifying section 5 is adjusted so that a phase margin for a stable matching operation will be obtained.

In this way, the distance between the winner which is the most important for data retrieval in the associative memory and the closest loser can be output within the range of the maximum gain area of the WLA, thereby improving the retrieval capability of the associative memory.

Next, a circuit configuration and operation of the feedback generating section 6 will be described.

The feedback signal generating section 6 is constituted by a p channel transistor $p_4$ and n channel transistor $n_4$ connected in series which are in a current mirror relation with the transistor $p_{3i}$ and transistor $n_{2i}$ connected in series of the distance amplifying section 5, and an n channel transistor which will be a load of a source-follower transistor $n_{3i}$ of the distance amplifying section 5.

A modified version of a high-speed minimum value circuit proposed by Opris is applied to generate a feedback voltage $\min\{C_i\}$ and to be connected to the distance amplifying section 5 (refer to I. E. Opris, "Rail-to-Rail Multiple-Input Min/Max Circuit", IEEE Trans. Circuit and Systems II, vol. 45, 137–141, 1998.).

The above modified version of the high-speed minimum value circuit proposed in the reference of Opris is applied to generate feedback and to amplify the distance. A minimum value function is realized in a manner that a drain current of the transistors $p_{3i}$ and $n_{2i}$ connected in series of the distance amplifying section 5 and a drain current of the p channel transistor $p_4$ and n channel transistor $n_4$ connected in series of the feedback generating section 6 are controlled by the common self-adjusting voltage $F_a$.

In other words, since the comparison signal $C_{win}$ of the winner row is a minimum value of comparison signals $C_1$ to $C_R$, and therefore produces a maximum drain current of transistors $P_{3win}$ and $n_{2win}$, the $LA_{win}$ output from $N_{win}$ is the maximum. Since the drain current of transistors $P_{3win}$ and $n_{2win}$ is transferred to a drain current of the p channel and n channel transistors connected in series in the feedback generating section 6, because they are in a current mirror relation with the $P_{3win}$ and $n_{2win}$, via the common self-controlling voltage $F_a$, the voltage $\min\{C_i\}$ approximately equal to the minimum value $C_{win}$ of the comparison signals $C_1$ to $C_R$ is output from the feedback generating section. In this case, the transistor circuit can be designed in such a manner as to equalize the $\min\{C_i\}$ with the $C_{win}$.

Next, an operation of the voltage follower 8 in the drive current generating section 7 will be described.

As described above, the feedback generating section 6 outputs a voltage $\min\{C_i\}$ approximately equal to the comparison voltage $C_{win}$ of the winner row. The voltage follower 8 in the drive current generating section 7 transfers the voltage $\min\{C_i\}$ to the signal control sections 4 of all the rows. In this way, the WLA is automatically self-adjusted to a stable state.

Figure 5:
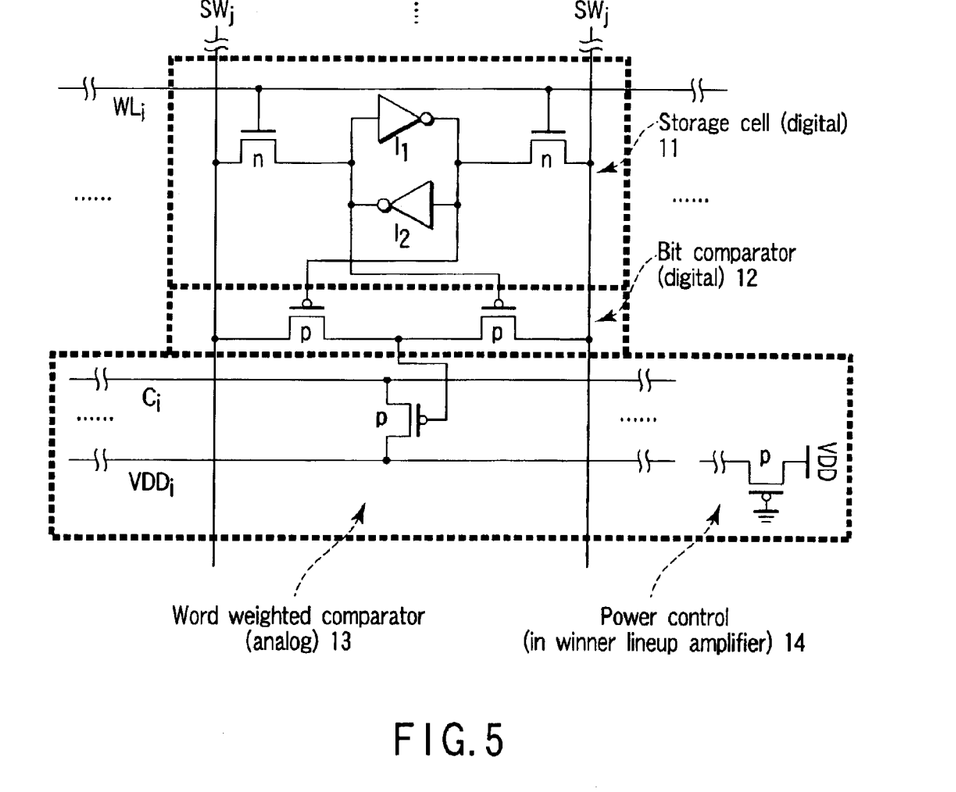
FIG. 5 is a diagram showing a 1-bit memory area in the associative memory of the present invention.

In the stable state, the current sinking capability of a transistor $n_{1win}$ of the signal control section 4 of the winner row is balanced with the current sinking capability of the p channel transistors of the word weighted comparator of the winner row shown for 1 bit in FIG. 5. The voltage follower 8 in the drive current generating section 7 can supply a high drive current required for an increase in the number of rows R in the memory area, so that it is possible to speed up the feedback.

As described above, since the WLA provided in accordance with the second embodiment has a boarder control range for feedback stabilization and automatically adjusts the maximum gain area in response to the minimum distance input $C_{win}$, it is possible to eliminate the possibility of inefficient data retrieval due to the insufficiency or excessiveness of control for adjusting the minimum distance input $C_{win}$ (see FIG. 2A, FIG. 2B).

Furthermore, by using the voltage follower 8 shown in FIG. 3, the high drive current required for the increase in the number of rows R in the memory area can be supplied from the voltage follower to speed up the feedback loop, when the semiconductor associative memory is used for data compression based on a code book, for example.

Still further, current control by the voltage $VDD_i$ over each word weighted comparator provided in the signal control section 4 shown in FIG. 3 can contribute to the limited maximum value of the current of the word weighted comparator and to the lowered power consumption of the semiconductor associative memory. Moreover, the voltage $VDD_i$ has an effect of improving a signal difference $|C_{win} - C_{lose}|$ in a static state between the winner and loser rows on the output line of the word weighted comparator. According to a simulation, this electrostatic signal difference is larger by more than a factor 10 than that in the reference of H. J. Mattausch et al.

Further yet, as shown in FIG. 3, in the WLA in accordance with the second embodiment, the number of transistors required for circuit configuration is only six per row, and the number of transistors is proportional to the number of rows R in the memory area, so that the row number of the semiconductor associative memory can be easily expanded.

In addition, in the WLA shown in FIG. 3, it is possible to obtain a circuit that similarly operates, by replacing the p channel transistor with the n channel transistor, and the n channel transistor with the p channel transistor, respectively. In this case, it is necessary to similarly replace the p channel transistor with the n channel transistor, and the n channel transistor with the p channel transistor, respectively, also in the circuits in the memory area.

Figure 4:
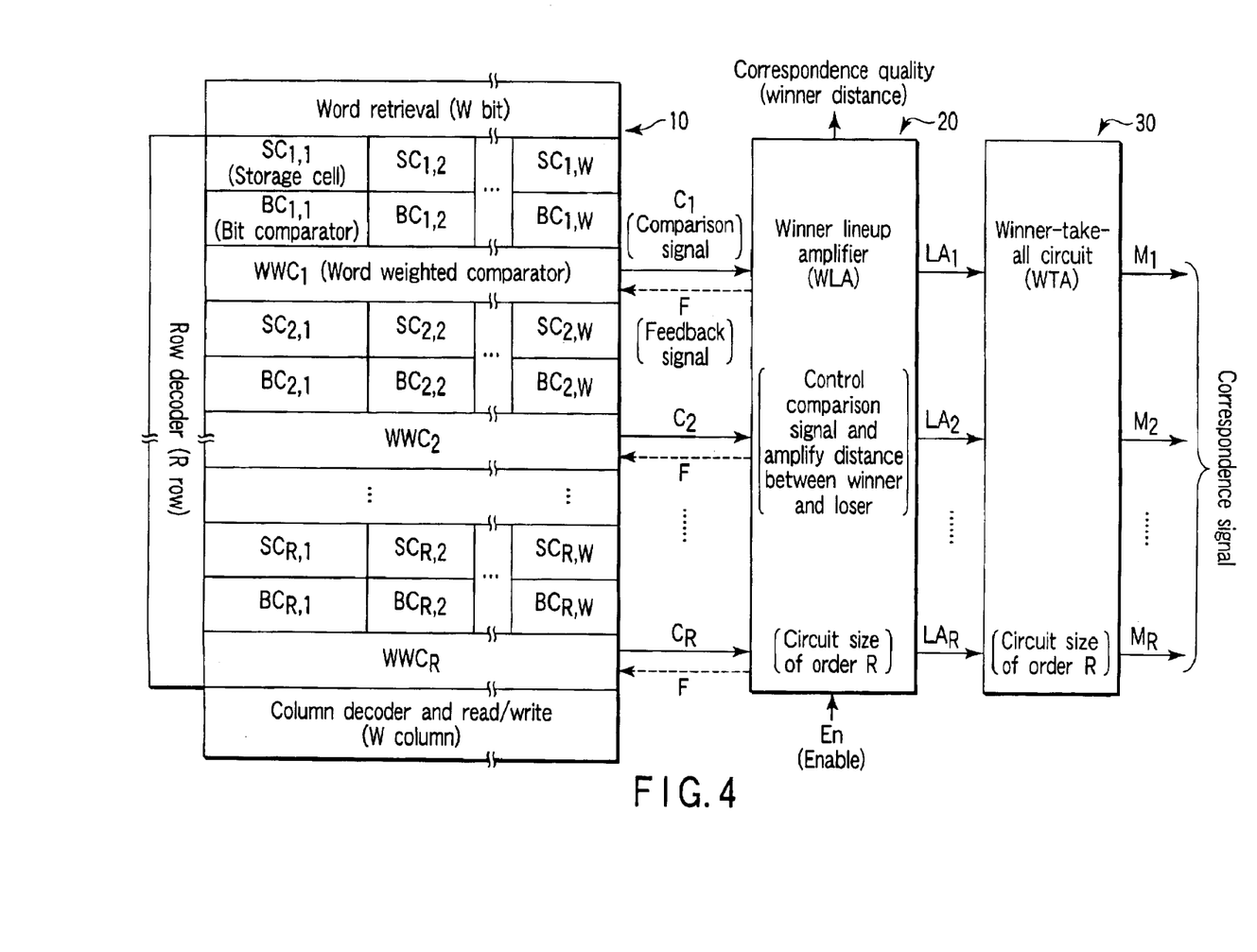
FIG. 4 is a block diagram of a fully parallel small area associative memory having a minimum distance retrieval function based on a hamming distance.

FIG. 4 shows a third embodiment of the present invention. The WLA in accordance with the third embodiment will be described below using FIG. 4. In the third embodiment, an application of the WLA of the present invention to the semiconductor associative memory will be described (refer to Jpn. Pat. Appln. No. 2002-008783 for a conventional WLA).

FIG. 4 is a block diagram of a fully parallel small area semiconductor associative memory which comprises a minimum distance retrieval function based on a hamming distance and uses the WLA of the present invention. The semiconductor associative memory shown in FIG. 4 is constituted by a memory area 10, a WLA 20 and a winner-take-all circuit (hereinafter referred to as WTA) 30.

The memory area 10 is constituted by an R row comprising the integrated bit comparators $BC_{i,j}$ (i=1 to R, j=1 to W, and the range of the suffixes i. j is the same below), storage cells $SC_{i,j}$ in a W column, and a word weighted comparator $WWC_i$ (hereinafter simply referred to as $WWC_i$) which is produced by weighting each bit in a word comparator.

A row decoder in the R row is connected to a left side of the memory area 10, and a word retrieval portion for inputting input data (W bit) is disposed at an upper side. Further, a column decoder in the W column is connected to a lower side, and thus reading and writing can be performed for every storage cell. The reference data of W bit per row R is previously written into each storage cell, and the reference data which is most analogous to the input data of W bit input to the word retrieval portion is identified as a winner.

In the semiconductor associative memory shown in FIG. 4, a winner is selected by means of the WLA 20 and WTA 30.

Here, in the WLA 20 of the present invention, the signal control section 4 shown in FIG. 3 controls the level of the comparison signal $C_i$ in order to amplify to the greatest extent the distance difference between a winner (reference data most analogous to the input data) and a loser (reference data other than the winner) in the first stage (see FIG. 2C), and then the distance amplifying section 5 is automatically self-adjusted via the feedback loop in the WLA 20 of the present invention so that the comparison signal (minimum level) of the winner is input into the range of maximum gain of the distance amplifying section.

The WTA 30 outputs a correspondence signal $M_i$ on receipt of a distance output signal $LA_i$ from the WLA 20. The correspondence signal $M_i$ becomes "1" for the winner row, and "0" for all the other rows (loser rows). Thus, the winner is finally decided. The comparison signal $C_i$ from the $WWC_i$ is input to an input section of the WLA 20, and the feedback signal F is sent back from the WLA.

A specific circuit configuration of the memory area for obtaining a hamming distance will next be described using FIG. 5. Here, the hamming distance is defined as the number of different bits between compared two data (W bit).

As shown in FIG. 5, a storage cell (SC) 11 comprises a SRAM cell constituted by use of two n channel transistors and inverters $I_1$ and $I_2$, and then a bit comparator (BC) 12 using two p channel transistors and the word weighted comparator (WWC) 13 using one p channel transistor per bit are connected in turn. The p channel transistors of the word weighted comparator (WWC) 13 are a signal source of the WLA.

Here, the word weighted comparator WWC (hereinafter, the suffix for the row number is omitted) which has been weighted can weight the bits of an optional winner differently if a proportion of a gate length to a gate width of the p channel transistor of the word weighted comparator (WWC) 13 is changed per bit, and thus can be adapted to a distance on an optional scale.

For the bit comparator (BC) 12 and word weighted comparator (WWC) 13, the p channel transistors are used instead of the n channel transistors so that they operate at low power consumption for the same size. Further, a reference voltage about 200 mV higher than a threshold value voltage of the p channel transistor is used as a logic "0" on a bit line instead of VSS in a retrieval operation.

In this way, it is possible to eliminate an influence of the threshold value difference in the p channel transistors (path transistors) of the bit comparator (BC) 12 on an effective gate voltage of the p channel transistor of the word weighted comparator (WWC) 13. The p channel transistor of the word weighted comparator (WWC) 13 switches into an on-state for a different bit between stored reference data and input data so that the capability as the current source will be the lowest for the winner row and that the $C_{win}$ of the winner row will be the minimum.

Next, a fourth embodiment will be described using FIG. 6 and FIG. 7. The configuration and performance of a test chip of the semiconductor associative memory comprising an experimentally produced WLA of the present invention will be described in the fourth embodiment. The experimental production of the test chip is carried out with a 0.6 $\mu$m CMOS technique, two-layer polysilicon, and a three-layer metal wiring process. A picture of a chip of the experimentally produced semiconductor associative memory core is shown in FIG. 6.

A storage capacity of reference data in the memory area is a word length of (pattern length) 768 bits×32 reference patterns (24 K bits in total). A designed area is 9.75 mm$^2$, in which an area occupied by a closest match unit constituted of the WLA and WTA is 0.307 mm$^2$, which is only 3.15% of the designed area. In this, the WLA occupies 1.37% and the WTA occupies 1.78%. Minimum distance retrieval time is less than 70 ns, power consumption is less than 43 mW in an operation at 10 MHz, power consumption per reference pattern is less than 1.35 mW, and a power source voltage is 3.3 V.

In this test chip, a word length of 768 bits is selected, and if each color in a full-color video signal image is rounded to 4- or 5-bit per pixel, this word length can be sufficiently applied to a use in high end applications such as image compression of a full-color video signal composed of 4×4 pixels, or to fingerprint matching after a ridge or valley line of the fingerprint is decreased to a one-pixel width, for example.

Figure 6:
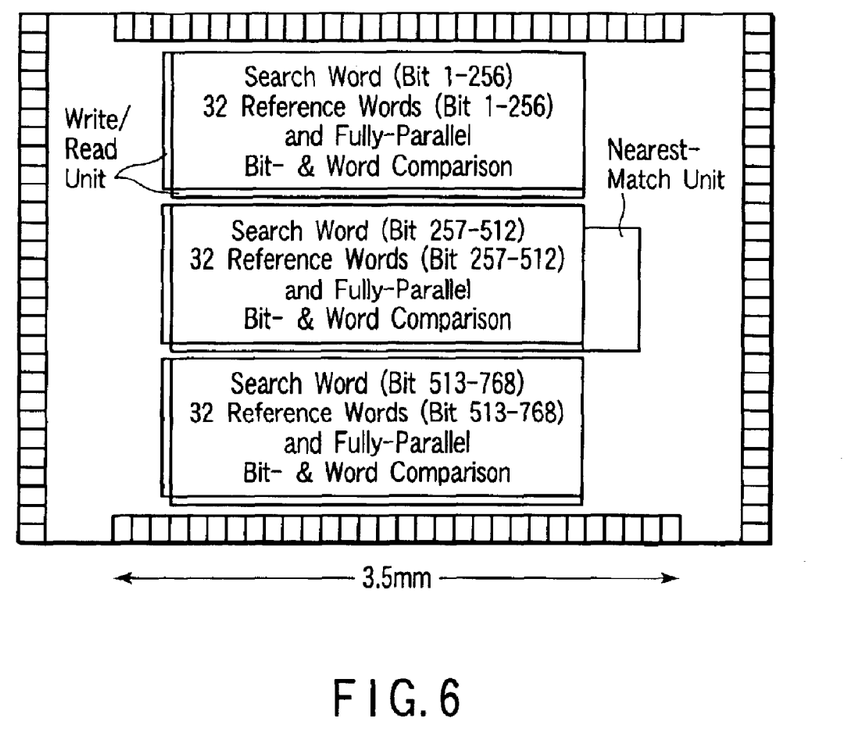
FIG. 6 is an image showing a semiconductor associative memory which has a self-adjusting winner lineup amplifier of the present invention.

In the memory area of the experimentally produced semiconductor associative memory, 32 rows are divided into three 256-bit fields which results in a word length of 768 bits in total, so as to accommodate the storage cell (SC) of the reference data, bit comparator (BC) and word weighted comparator (WWC), as shown in FIG. 6.

Since the memory area is composed of a word length of 128 bits×32 rows in the reference of H. J. Mattausch et al., the storage capacity of reference data in the memory area of this experimentally produced semiconductor associative memory is enlarged six times as great as that in the above reference, and moreover, power consumption can be reduced by nearly a factor 10 as compared with that in the above reference.

Next, a relationship between average minimum distance retrieval time and a distance between the winner and the input in association with the experimentally produced test chip will be described using FIG. 7. Regarding the cases where the distances between minimum distance reference data (winner) and closest reference data (closest loser) are 1 bit and 5 bits, results of measuring average minimum distance retrieval time in the test chip of the associative memory core are shown in FIG. 7.

For the patterns of the minimum distance reference data and closest reference data, results of measurements at ten physically different places (different rows) are plotted. It is apparent from the size of error bars that the difference of measured data is very small even in a most critical case where the distance between the minimum distance reference data and the closest reference data is 1 bit.

Figure 7:
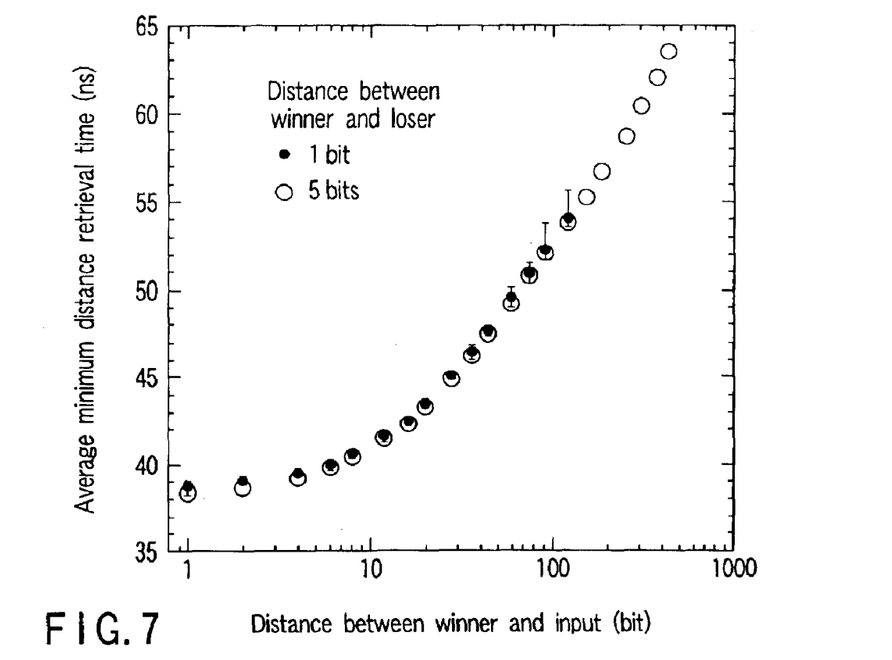
FIG. 7 is a graph showing average minimum distance retrieval time in a test chip of the associative memory, when distances between a minimum distance reference data (winner) and a closest reference data (closest loser) are 1 bit and 5 bits.

It is found out from FIG. 7 that if the minimum distance retrieval time of the experimentally produced semiconductor associative memory is measured, it is less than 70 ns, which is extremely fast, for distances between the winner and input of less than 124 bits and less than 444 bits, when distances between the winner and loser are 1 bit and 5 bits.

As described above, it is obvious that, according to the semiconductor associative memory equipped with the WLA of the present invention, expandability is high in terms of a large number of stored reference data, that is, the number of rows in the memory area, so that the number of bits of the reference data can be increased, and further high speed is achieved while power consumption per row of the reference data is low.

The present invention is not limited to the above embodiments. It has been described, for example, in the third embodiment, that the WLA of the present invention is used so as to realize a pattern matching function of the fully parallel associative memory, but the use of the WLA of the present invention is not necessarily limited to the pattern matching of the fully parallel associative memory.

The WLA of the present invention can be widely applied, for example, to a network router, code book base data compression, object recognition and the pattern matching in an artificial intelligence system, a data bank system, an Internet rooter and a mobile terminal (e.g., mobile video terminal). In addition, various modifications can be implemented without departing from the gist of the present invention.

As described above, according to the WLA of the present invention, it is possible to provide a fully parallel associative memory having a wide control range which can automatically adjust the maximum gain area in response to a minimum distance input and easily be expanded in response to the increase in the number of inputs.

What is claimed is:

1. A self-adjusting winner lineup amplifier comprising:
   signal control sections which input a comparison signal ($C_i$; a suffix i is a row number) from a word weighted comparator disposed in each row of a memory area;
   a self-adjusting distance amplifying section which amplifies output signals of said signal control sections whose levels are controlled by the signal control sections, and output the amplified comparison signals as distance amplified signals ($LA_i$);
   a feedback generating section which inputs a self-adjusting voltage ($F_a$) common to the distance amplifying sections corresponding to the respective rows in the memory area; and
   a drive current generating section comprising a voltage follower which converts an output voltage ($\min\{C_i\}$) from the feedback generating section into a feedback voltage (F) supported by a large driving current;
   wherein said feedback voltage (F) is supplied in parallel to the signal control sections corresponding to the respective rows in the memory area; amplification characteristics of the distance amplifying section are self-adjusted by a comparison signal ($C_{win}$) of a winner row among the comparison signals ($C_i$); and said signal control sections lead at least the comparison signal ($C_{win}$) of the winner and the corresponding control section's output signal into the range of a maximum gain area of the distance amplifying section.

2. The self-adjusting winner lineup amplifier according to claim 1, wherein the signal control section comprises:
   a first signal line for the word weighted comparator which transfers the comparison signal ($C_i$);
   a second signal line for the word weighted comparator which transfers a voltage ($VDD_i$) for controlling electric power of the comparison signal ($C_i$);
   a third signal line which supplies the feedback voltage (F) in parallel to the signal control sections corresponding to the respective rows in the memory area;
   a fourth signal line which activates the signal control sections;

a first n channel transistor in which a drain is connected to the first signal line, a gate is connected to the third signal line and a source is grounded;

a first p channel transistor in which a source is connected to a power source (VDD), a gate is grounded and a drain is connected to the second signal line; and a second p channel transistor in which a source is connected to the power source (VDD), a gate is connected to the fourth signal line and a drain is connected to the first signal line; and wherein the feedback voltage (F) is input to the gate of the first n channel transistor, and the level of the comparison signal ($C_i$) is controlled by the first n channel transistor.

3. The self-adjusting winner lineup amplifier according to claim 1, wherein for each signal control section the self-adjusting distance amplifying section comprises:

a third p channel transistor in which a source is connected to a power source (VDD);

a second n channel transistor in which the source is grounded;

a third n channel transistor in which the drain is connected to the power source (VDD), the source is connected to the gate of the second n channel transistor and the gate is connected to the drain of the second n channel transistor; and a capacitor (C) one terminal of which is connected to the gate of the third p channel transistor and the other terminal of which is grounded; and the drain of the third p channel transistor and the drain of the second n channel transistor are connected to each other to form an output section ($N_i$); the source of the third n channel transistor is connected to the common signal line of the self-adjusting voltage ($F_a$); the comparison signal ($C_i$) whose level is controlled by the signal control section is input to the gate of the third p channel transistor;

the distance amplified signal ($LA_i$) is output from the output section ($N_i$), and a source voltage of the third n channel transistor is transferred as the self-adjusting voltage ($F_a$) to the common signal line.

4. The self-adjusting winner lineup amplifier according to claim 1, wherein the feedback signal generating section comprises:

a fourth p channel transistor in which a source is connected to the power source (VDD) and a gate is connected in common with a drain;

a fourth n channel transistor in which a drain is connected to the drain of the fourth p channel transistor to form an output section of the feedback generating section, a gate is connected to the common signal line of the self-adjusting voltage ($F_a$) and a source is grounded; and a fifth n channel transistor in which the drain is connected to the common signal line of the self-adjusting voltage ($F_a$), the gate is connected in common with the drain and the source is grounded; and the self-adjusting voltage ($F_a$) is input to the gate of the fourth n channel transistor, and the output voltage ($\min\{C_i\}$) is output from the output section of the feedback generating section.

5. The self-adjusting winner lineup amplifier according to claim 1, wherein the voltage follower constituting the drive current generating section inputs the output voltage ($\min\{C_i\}$) from the feedback generating section, converts it into a feedback voltage (F), and supplies this feedback voltage (F) in parallel from the output section of the voltage follower to the gate of the first n channel transistor in the signal control sections corresponding to each row in the memory area; and the voltage follower is activated simultaneously with the signal control sections.

6. The self-adjusting winner lineup amplifier according to claim 1, wherein an equivalent operation of the self-adjusting winner lineup amplifier is possible by replacing the n channel transistor with the p channel transistor constituting the amplifier or vice versa, and replacing the n channel transistor with the p channel transistor constituting the memory area or vice versa.

7. The self-adjusting winner lineup amplifier according to claim 1, wherein the number of transistors constituting the self-adjusting winner lineup amplifier is proportional to the number of rows (R) in the memory area.

8. The self-adjusting winner lineup amplifier according to claim 1, wherein the voltage ($VDD_i$) which controls the electric power of the comparison signal ($C_i$) restricts a maximum value of current flowing through the word weighted comparator to reduce power consumption by the comparison signal ($C_i$).

9. The self-adjusting winner lineup amplifier according to claim 2, wherein the voltage ($VDD_i$) which controls the electric power of the comparison signal ($C_i$) enlarges a signal difference $|C_{win}-C_{lose}|$ in a static state between the comparison signal ($C_{win}$) of a winner row and the comparison signal ($C_{lose}$) of a loser row output from the word weighted comparator.

* * * * *